(12) United States Patent
Rieger

(10) Patent No.: US 9,109,765 B2
(45) Date of Patent: Aug. 18, 2015

(54) LIGHTING MODULE, LIGHTING STRIP INCLUDING A PLURALITY OF CONTIGUOUS LIGHTING MODULES, AND METHOD FOR PREPARING A LIGHTING STRIP

(75) Inventor: Thomas Rieger, Aufhausen (DE)

(73) Assignee: OSRAM GmbH, Munich (DE)

( * ) Notice: Subject to any disclaimer, the term of this patent is extended or adjusted under 35 U.S.C. 154(b) by 647 days.

(21) Appl. No.: 13/386,440

(22) PCT Filed: Jun. 21, 2010

(86) PCT No.: PCT/EP2010/058692
§ 371 (c)(1),
(2), (4) Date: Jan. 23, 2012

(87) PCT Pub. No.: WO2011/012375
PCT Pub. Date: Feb. 3, 2011

(65) Prior Publication Data
US 2012/0120644 A1    May 17, 2012

(30) Foreign Application Priority Data

Jul. 30, 2009 (DE) .......................... 10 2009 035 369

(51) Int. Cl.
F21S 4/00 (2006.01)
F21S 2/00 (2006.01)
F21V 23/06 (2006.01)
F21V 31/04 (2006.01)
(Continued)

(52) U.S. Cl.
CPC .. *F21S 4/00* (2013.01); *F21S 4/006* (2013.01); *F21V 23/06* (2013.01); *F21V 31/04* (2013.01); *F21Y 2101/02* (2013.01); *H05K 3/3405* (2013.01); *H05K 3/403* (2013.01); *H05K 2201/10287* (2013.01); *Y10T 29/49821* (2015.01)

(58) Field of Classification Search
CPC ............. F21S 4/001; F21S 4/00; F21S 4/006; F21Y 2103/00; F21Y 2101/02; A41D 27/085; F21V 31/04; F21V 23/06; Y10T 29/49821
USPC ......... 362/382, 219, 231, 238, 240, 800, 307, 362/224.245
See application file for complete search history.

(56) References Cited

U.S. PATENT DOCUMENTS 6,582,103 B1 * 6/2003 Popovich et al. ............. 362/307
2002/0114155 A1 * 8/2002 Katogi et al. ................. 362/219
(Continued)

FOREIGN PATENT DOCUMENTS

CN    101113807 A    1/2008
DE    10322561 A1    12/2004
(Continued)

OTHER PUBLICATIONS

English Abstract of EP 1980785 A1.
(Continued)

*Primary Examiner* — Joseph L Williams

(57) ABSTRACT

A lighting module includes a strip-shaped carrier. At least one light source, and at least one electrical contact element that can be contacted at the edge, are present on the strip-shaped carrier. The at least one light source may be a semiconductor lighting element. The at least one electrical contact element is designed as a material volume element.

17 Claims, 3 Drawing Sheets

(51) Int. Cl.
*H05K 3/34* (2006.01)
*H05K 3/40* (2006.01)
*F21Y 101/02* (2006.01)

(56) References Cited

U.S. PATENT DOCUMENTS

2005/0092517 A1   5/2005   Fan
2007/0047243 A1   3/2007   Hacker et al.

FOREIGN PATENT DOCUMENTS

| DE | 202005006643 | U1 | 10/2005 |
| DE | 202006017983 | U1 | 3/2007 |
| DE | 202008007474 | U1 | 9/2008 |
| EP | 0911573 | A2 | 4/1999 |
| EP | 1357331 | A2 | 10/2003 |
| EP | 1760392 | A1 | 3/2007 |
| EP | 1980785 | A1 | 10/2008 |
| WO | 2005024291 | A2 | 3/2005 |
| WO | 2009143877 | A1 | 12/2009 |

OTHER PUBLICATIONS

English Abstract of DE 202005006643 U1.
English Abstract of DE 10322561 A1.
English Abstract of DE 202006017983 U1.
English Abstract of CN 101113807 A, dated Jan. 30, 2008.

* cited by examiner

LIGHTING MODULE, LIGHTING STRIP INCLUDING A PLURALITY OF CONTIGUOUS LIGHTING MODULES, AND METHOD FOR PREPARING A LIGHTING STRIP

RELATED APPLICATIONS

The present application is a national stage entry according to 35 U.S.C. §371 of PCT application No.: PCT/EP2010/058692 filed on Jun. 21, 2010, which claims priority from German application No.: 10 2009 035 369.0 filed on Jul. 30, 2009.

TECHNICAL FIELD

Various embodiments relate to a lighting module including a strip-shaped carrier.

BACKGROUND

Quasi-endless flexible LED lighting strips, which consist of a contiguous series of strip-shaped standard circuit boards or standard circuit board sections ('lighting modules') and can be separated at defined intervals between two lighting modules (e.g. every 200 mm), are known. Each LED lighting strip typically features a plurality of light-emitting diodes (LEDs) on its upper side. Such LED lighting strips are known from the LINEARLight range produced by OSRAM, for example. A problem relating to LED lighting strips is characterized in that any extension of a lighting strip by means of concatenating two lighting modules is associated with an increase in the interval (pitch interval) between the LEDs that are arranged at both ends near to the plug connector; this results in an uneven illumination. The exposure of the electrical contacts at a separation point can also be troublesome.

LED lighting devices in which an LED lighting strip is inserted into a longitudinally strip-shaped U-profile and then completely encapsulated by a transparent encapsulating material are also known. An LED lighting strip encapsulated thus has the advantage of being protected against various environmental influences.

LED lighting devices in which an LED lighting strip is inserted into a strip-shaped C-profile and then completely encapsulated by a transparent encapsulating material are also known. The lighting strip is thus protected against UV radiation and other environmental influences, but implementation is resource-intensive and unsuitable for large lengths.

Various embodiments address the problem of providing a particularly simple and robust means of contacting lighting strips that can be prepared.

SUMMARY

Various embodiments provide a lighting module including a strip-shaped carrier (also referred to as a lighting module carrier), wherein provision is made on the carrier for at least one light source, in particular a semiconductor lighting element, and at least one electrical contact element that can be contacted at the edge. The at least one electrical contact element is designed in each case as a material volume element. The use of a material volume element as a contact element results in a particularly robust contact element. The material volume element also provides a particularly simple means of allowing contact from more than one side, thereby providing flexible contact options.

Depending on its type, the strip-shaped carrier has two carrier sides for the arrangement of elements. In order to simplify the description without thereby restricting the invention, these can also be referred to as a top side and a bottom side of the carrier. If a plurality of light sources are provided, these can be attached to one carrier side or to both carrier sides.

In addition to the at least one light source and the at least one contact element, further components such as electrical and/or electronic elements can also be attached to the carrier.

The at least one electrical contact element can be present on the same carrier side as the at least one light source or on the opposite carrier side to the at least one light source. Arranging the at least one light source and the at least one electrical contact element on the same carrier side has the advantage that the carrier can be laid flat on the other carrier side.

A contact element that can be contacted at the edge is a contact element that can be contacted in the direction of an edge side of the carrier or of the lighting module. In other words, a contact element that can be contacted at the edge is a contact element which features a contact surface that is present on the peripheral edge of the carrier or lighting module (and which therefore does not have a contact surface for contacting from above or below).

A material volume element is a compact (full-volume) volume element which is made of one or more materials and is significantly elongated in three dimensions. Unlike flat and therefore functionally two-dimensional contacts (contact pads), the material volume element therefore has a significant height. Consequently, the material volume element can have a contact surface that can be contacted at the edge. The height of this contact surface can essentially correspond to the height of the material volume element.

The material volume element does not need any substructures for the purpose of electrical conduction. Rather, the material volume element can correspond essentially to a conductor. In particular, a volume element is not plug-in elements such as plug connectors or sockets.

The light source preferably has at least one semiconductor lighting element. The semiconductor lighting element can include e.g. an organic light-emitting diode (e.g. an OLED), an inorganic light-emitting diode, or a diode laser. The light source can take the form of an LED cluster including in each case a light-emitting diode or a plurality of light-emitting diodes, for example. The light-emitting diodes can emit one-colored or multi-colored rays, e.g. white. If a plurality of light-emitting diodes are present, they can shine with e.g. the same color (one color or multiple colors) and/or different colors.

An LED cluster can therefore include a plurality of individual LEDs ('LED cluster') which can together produce a white blended light, e.g. 'cold white' or 'warm white'. In order to generate a white blended light, the LED cluster preferably includes light-emitting diodes which shine with at least the basic colors red (R), green (G) and blue (B). In this case, individual colors or a plurality of colors can also be generated by a plurality of LEDs simultaneously, allowing combinations such as RGB, RRGB, RGGB, RGBB, RGGBB, etc. However, the color combination is not limited to R, G and B. One or more amber-colored LEDs (A) or mint green-colored LEDs (M) can be provided in order to generate a warm white color tone, for example.

If LEDs with different colors are used, they can be so activated as to emit rays in a tunable RGB color range.

This lighting module has the advantage that it is particularly easy to assemble, and is robust and easy to handle.

According to a possible embodiment, the carrier can also be designed as a circuit board including at least one conductive track, wherein the at least one conductive track can run along the same carrier side as the at least one light source and/or on the other carrier side relative to the at least one light source.

According to a further possible embodiment, the carrier is a flexible carrier and/or the lighting module is a flexible lighting module.

According to a further possible embodiment, the material volume element is essentially metallic. For example, aluminum, copper and/or alloys thereof can be used as metals. However, the invention is not restricted to metals. This means that other electrically conducting materials such as electrically conductive ceramics or plastics can also be used.

According to a further possible embodiment, the material volume element incorporates copper. Copper has very good conductivity and handling characteristics.

According to a further possible embodiment, the material volume element is coated. The coating can be achieved by means of special coating methods, or by other layer-forming methods such as electroplating, etc.

According to a further possible embodiment, the material volume element is tin-plated. Simple and economical means can therefore be used to generate a protective layer that is easy to handle and is in particular easy and reliable to solder since the tin provides a stock of solder.

According to a further possible embodiment, the material volume element is square. This allows the height of the contact surface, which corresponds to a surface of the square, to be adjusted precisely. In addition, the contact surface is completely vertical and therefore particularly easy to contact.

According to a further possible embodiment, the material volume element is cuboid. This means that every surface of the material volume element is identical, and therefore installation of the material volume element is particularly straightforward.

According to a further possible embodiment, the material volume element can be contacted at least at a front end. A front end can be understood to mean in particular that section of the side edge which delimits the strip-shaped carrier or the strip-shaped lighting module in a longitudinal direction.

According to a further embodiment, the material volume element can be contacted along its side, from above and/or from below. The significantly increases the terminal flexibility.

According to a further possible embodiment, the at least one material volume element can be installed on the carrier by means of an assembly process. The material volume element can therefore be manufactured accurately and easily on a large scale.

According to a further embodiment, the carrier is assembled and the assembled carrier is encapsulated in a material that is at least partially pellucid. By virtue of the encapsulation, the lighting module can be protected against external influences. The at least one light source can radiate light outwards through the at least partially pellucid material. The at least partially pellucid material can be transparent or translucent.

According to a further embodiment, the assembled carrier is encapsulated in a silicone material. The silicone material has the advantage of being flexible such that, in the case of a flexible lighting module, the flexibility thereof can be maintained at least to some extent. Silicone is also hardwearing, non-toxic, easy to handle and easy to color.

According to a further embodiment, the carrier is inserted into an opaque silicone profile and is encapsulated in the silicone profile by means of a pellucid silicone, wherein the at least one light source is so arranged that it emits rays through the pellucid silicone. The silicone profile can have a U-shaped cross section, for example, wherein the lighting module lies on the 'base' of the U. In particular, the lighting module and the bottom side of the carrier can lie flat on the base of the profile, while the at least one light source, the at least one material volume element and possibly further assembled elements are present on the upper side of the carrier.

The problem is further solved by a lighting strip, wherein the lighting strip features a plurality of such contiguous lighting modules, wherein the lighting strip can be separated between two adjacent lighting modules. By virtue of these preparation options, a length of the lighting strip can be adjusted individually. Furthermore, a quasi-endless strip method (e.g. reel-to-reel manufacturing) can be used for manufacturing the lighting strip.

The problem is further solved by a method for preparing such a lighting strip, wherein the method includes the following steps: separating the lighting strip between at least two adjacent lighting modules and removing material on at least one separation surface, until the at least one material volume element concerned is exposed in a manner allowing for contact.

Use of the mechanically relatively hardwearing material volume element in this case has the advantage that it can be exposed using a multiplicity of different material removal methods and without difficulty even by untrained personnel.

According to a development, the removal step involves grinding, filing and/or abrading. These types of removal are particularly simple and can be performed without the need for complex equipment, even in the field.

According to a further development, the method includes the step of connecting the at least one material volume element to at least one terminal conductor.

According to a further development, this connection can involve soldering the at least one terminal conductor to the material volume element. Soldering has the advantage of being easy to implement and allowing an electrically and mechanically reliable connection between the material volume element and the terminal conductor.

According to a further possible development, the at least one terminal conductor (e.g. a cable) branches off sideways or laterally (upwards, downwards, leftwards and/or rightwards). This facility whereby the conductor can branch off sideways in any direction has the advantage that such a terminal conductor requires only a small amount of space in a longitudinal direction of the lighting module or lighting strip, and therefore a small interval between two differently contacted lighting modules can be maintained. In particular, an interval between two serially arranged light sources ('pitch' or 'pitch interval') can also be essentially maintained over and beyond two separate lighting modules. Therefore a plurality of lighting modules can abut each other without any increase in the pitch interval, for example.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which: p

DETAILED DESCRIPTION

The following detailed description refers to the accompanying drawings that show, by way of illustration, specific details and embodiments in which the invention may be practiced.

Figure 1:
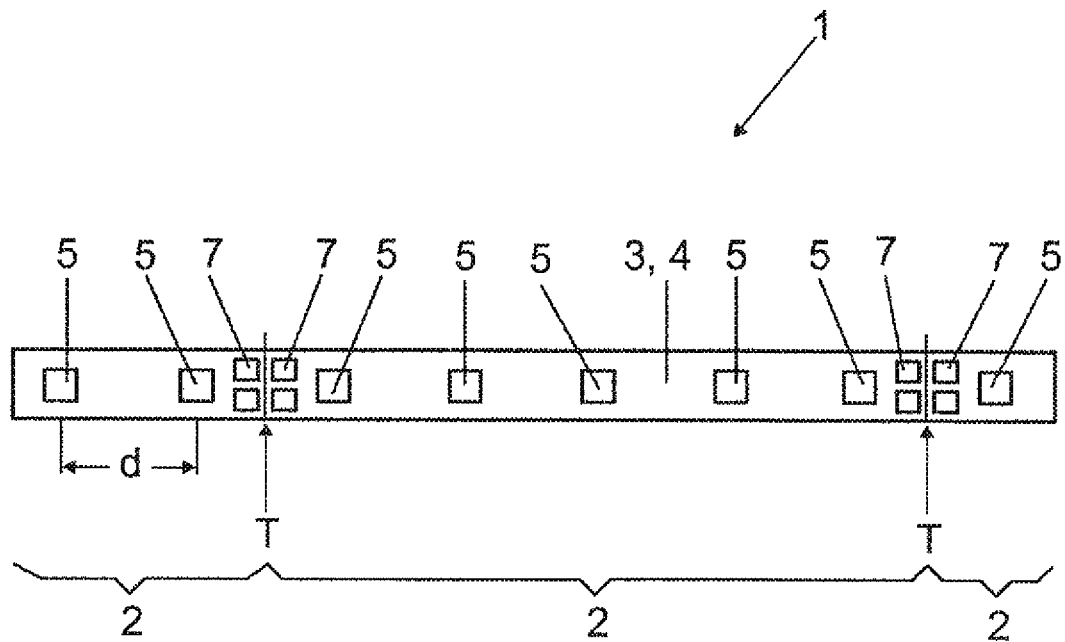
FIG. 1 shows a plan view of a lighting strip including a plurality of lighting modules.
Figure 2:
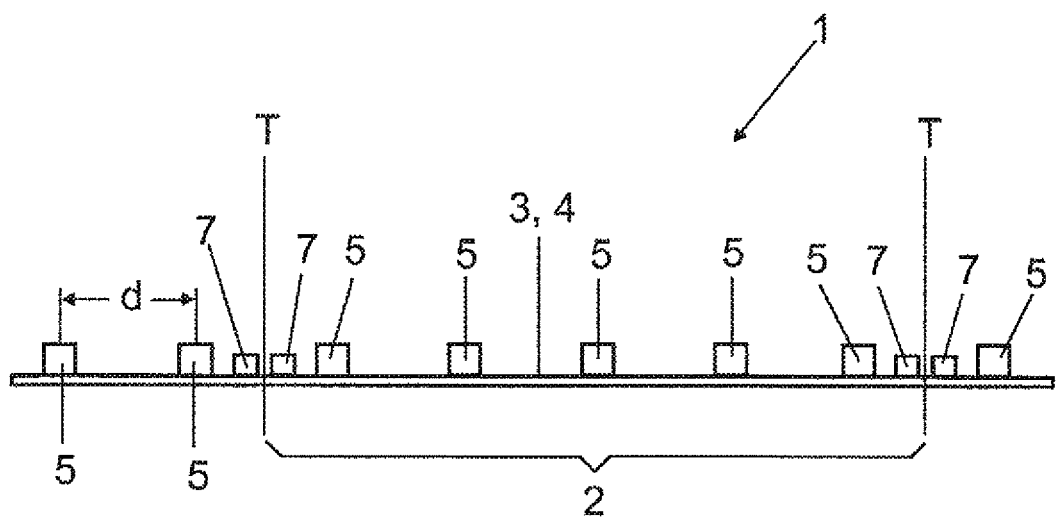
FIG. 2 shows a side view of the lighting strip from FIG. 1.

FIG. 1 shows a plan view (i.e. an upper side) of a lighting strip 1 including a plurality of integrally contiguous lighting modules 2. FIG. 2 shows the lighting strip 1 in a side view. The lighting modules 2 feature a flexible strip-shaped carrier 3 which has been manufactured integrally.

Each of the lighting modules 2 features four light sources in the form of upwardly radiating light-emitting diodes (top LEDs) 5 arranged in a row on the upper side of the respective carrier section, subsequently referred to as a lighting module carrier 4. The interval between two adjacent light-emitting diodes 5 is subsequently referred to as a pitch interval d. The pitch interval d of the light-emitting diodes of a lighting module 2 is constant. The pitch interval d of two light-emitting diodes 5 that are situated on adjacent lighting modules 2 is also essentially identical. The pitch interval d of the light-emitting diodes 5 of the entire lighting strip 1 is therefore essentially the same. It is therefore possible to achieve uniform illumination by means of the lighting strip 1, even in relation to a surface area.

The lighting modules 2 can be separated at suitably identified local separation points T. A local front end of the separated lighting module is created at the separation points T as a result of separation or splitting. In addition to a separation point T, each of the lighting modules 2 features one or more cuboid material volume elements 7 at the front end, these being marked twice at each of the front ends purely by way of example here. Directly after the separation, the material volume elements 7 are not yet flush with the front end edge of the lighting module carrier 4 in this case, but are offset slightly inwards therefrom.

The material volume elements 7 consist in each case of a tin-plated solid copper block. The soft tin layer (or equivalent) protects the copper and also provides a stock of solder, whereby soldering is facilitated. In this exemplary embodiment, the material volume elements 7 are manufactured separately from the carrier 3 and are installed on the carrier 3 subsequently. This assembly of the material volume elements 7 can be effected such that the material volume elements 7 are installed on local contact banks (contact pads or equivalent), e.g. by means of an electrically conductive adhesive or by means of soldering. According to a possible embodiment, the contact banks correspond to the conventional contact banks of a known LED lighting strip. The known LED lighting strip then need not be modified for the purpose of installing the material volume elements 7.

Figure 3:
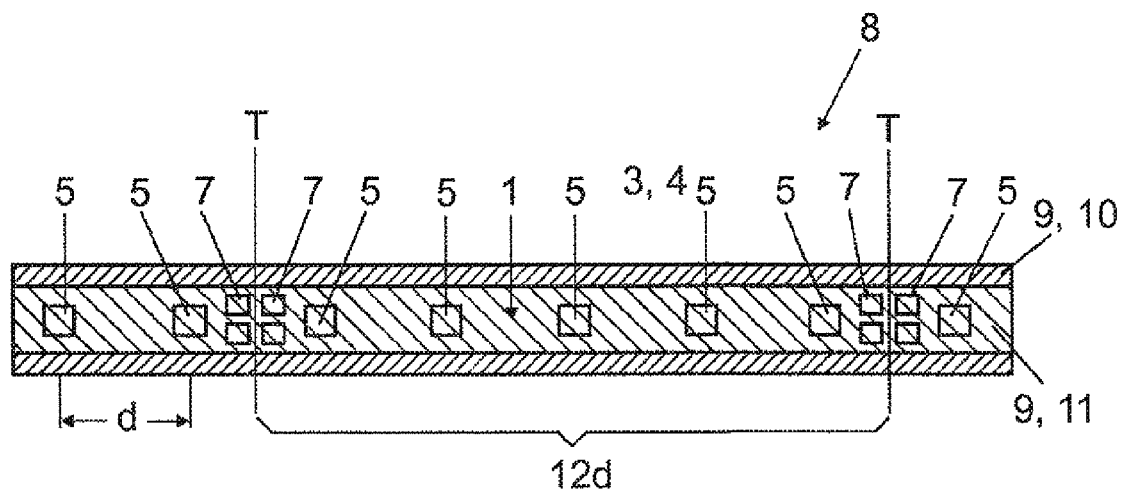
FIG. 3 shows a plan view of the lighting strip from FIG. 1 in an encapsulated state.

FIG. 3 shows a plan view of a further lighting strip 8. The lighting strip 8 corresponds to the lighting strip 1, but is now additionally surrounded by a hatched marked silicone case 9. The silicone case 9 has a U-shaped profile 10 made of an opaque white silicone material. The lighting strip 1 is laid flat on its bottom side in the profile 10. The light-emitting diodes 5 and material volume elements 7 are situated on the upper side of the carrier 3.

The lighting strip 1 is encapsulated in the profile 10 by a pellucid encapsulating material 11 made of silicone, such that the lighting strip 1 is completely surrounded at least laterally by silicone. As a result, the lighting strip 1 can be well protected against environmental influences. Moreover, the lighting strip 8 can still be of flexible design, since silicone is likewise flexible.

Figure 4:
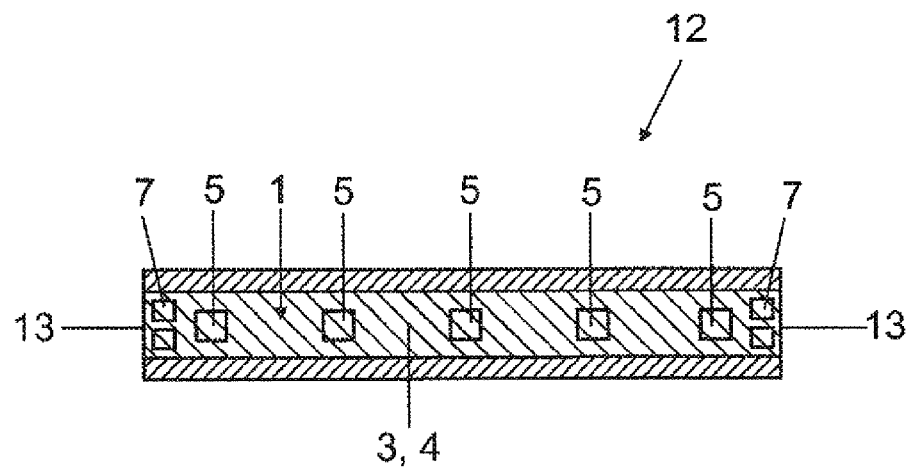
FIG. 4 shows a plan view of a lighting module of the encapsulated lighting strip from FIG. 3 in an isolated state.

FIG. 4 shows a plan view of a lighting module 12 that has been isolated from the encapsulated lighting strip 8 as per FIG. 3 by means of separation at the suitably marked separation points T. The separation can be effected e.g. by cutting with the aid of scissors or parting with the aid of a knife or pincers.

As a result of the separation, a free front end 13 is created at each short side edge. The material volume elements 7 do not yet lie immediately at the front end 13, but are still situated at a small interval distant therefrom. Consequently, contacting of the material volume elements 7 immediately after separation is not usually possible. This has the advantage that the material volume elements 7 are protected by the silicone material of the silicone case 9 in the event that contacting might not be desired or might not be desired yet.

A possible sequence for contacting the lighting module 12 is explained in greater detail below.

Figure 5:
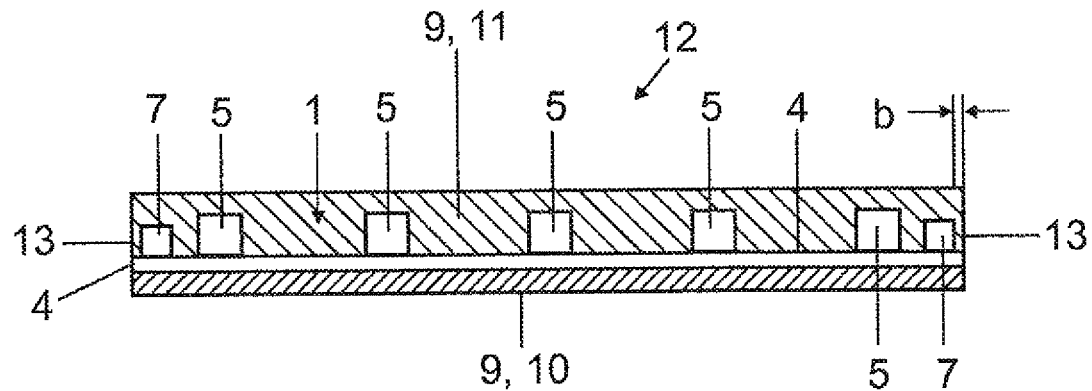
FIG. 5 shows a sectional side view of a lighting module in an encapsulated state.

FIG. 5 shows a side view of the lighting module 12 from FIG. 4 as a sectional representation through a material volume element 7. The silicone material of the silicone case 9, having a thickness b, is still present between the front end 13 of the lighting module 12 and the respective material volume element 7 that is arranged there. The silicone material is electrically insulating, such that contacting of the material volume element 7 is not yet possible.

Figure 6:
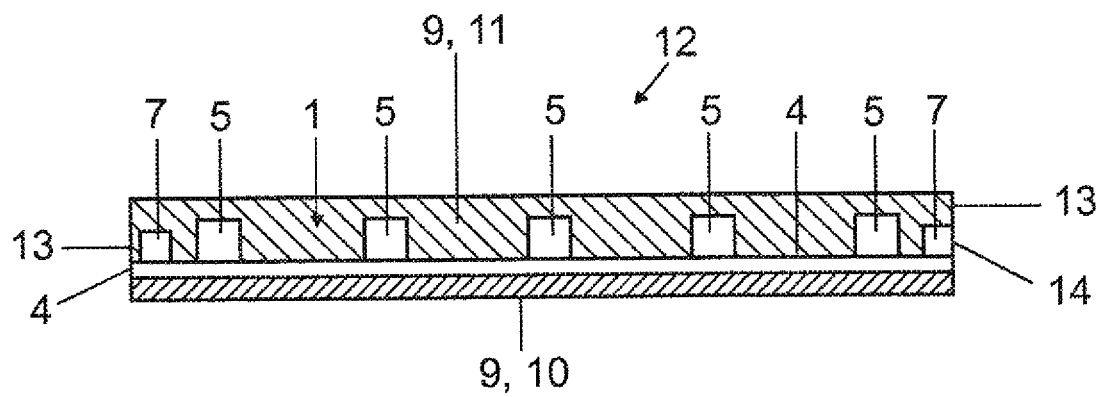
FIG. 6 shows a sectional side view of the lighting module from FIG. 5 including a removed front end.

FIG. 6 shows the lighting module 12 whose front end 13 has been removed on the right-hand side by way of example. In order to contact the material volume element 7, the material of the front end 13 is removed to the width b, specifically the module carrier 4 and the silicone case 9. The removal can be effected by any suitable method, e.g. by means of grinding, filing and/or abrading.

As a result of this, the material volume elements 7 at the front end are now exposed and consequently provide a local contact surface 14 at the front end 13. The tin layer at the front end 13 of the local material volume element 7 is not removed (or is only partly removed) by the removal of material from the front end of the lighting module 12, and therefore the contact surface 14 is a pretinned copper surface that is particularly easy to solder.

Figure 7:
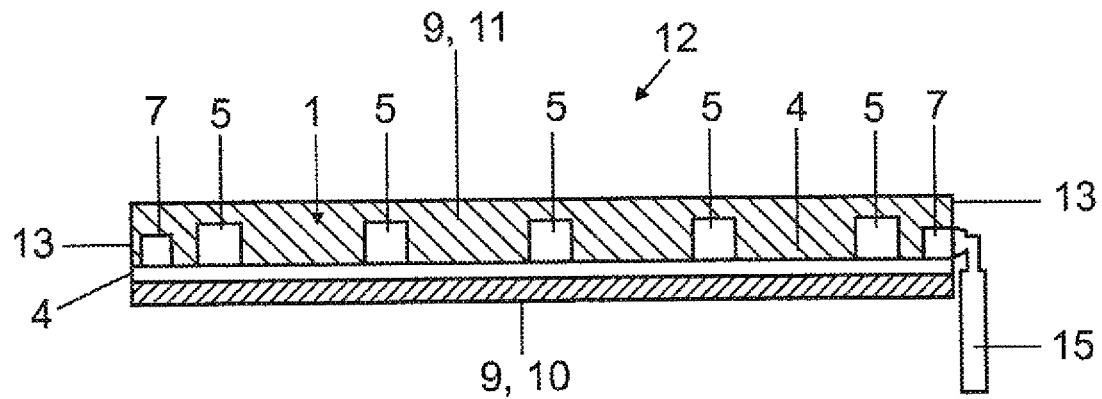
FIG. 7 shows a sectional side view of the lighting module from FIG. 6 including a contacted front end.

FIG. 7 shows the lighting module 12 and a front end 13 that has been contacted on the right-hand side. In this case, a terminal conductor in the form of a terminal cable 15 branching off downwards has been attached by means of soldering to the contact surface 14 of the relevant material volume element 7. By virtue of this lateral branching-off, it is possible to limit any structural space that is required in a longitudinal direction for the terminal cable 15. Consequently, a further lighting module that is likewise contacted can be arranged so close to the front end 13 that the pitch interval between the two adjacent light-emitting diodes 5 of the two lighting modules corresponds essentially to the pitch interval d of the lighting modules 12 or lighting strips 1 or 8 on an integral carrier 4 or 3.

The present invention is obviously not restricted to the exemplary embodiment shown here.

For example, in addition to using its front end 13 for this purpose, the lighting module can also be contacted laterally by simply removing the silicone case 9 on the side of the relevant material volume element 7, or from above by removing the encapsulating material 11 on top of the relevant material volume element 7. Contacting can even be effected from below, by removing at least part of the silicone case 9 and material of the carrier 3 or lighting module carrier 4 under the relevant material volume element 7. This possibility of contact on almost all sides is supported by the shape of the material volume element 7, said shape being to a large extent directionally independent.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

LIST OF REFERENCE SYMBOLS

1 Lighting strip
2 Lighting module
3 Carrier
4 Lighting module carrier
5 Light-emitting diode
6
7 Material volume element
8 Lighting strip
9 Silicone case
10 Profile
11 Encapsulating material
12 Lighting module
13 Front end
14 Contact surface
15 Terminal cable
b Thickness
d Pitch interval
T Separation point

The invention claimed is:

1. A lighting module comprising a strip-shaped carrier, wherein at least one light source, and at least one electrical contact element that can be contacted at the edge are present on the strip-shaped carrier, wherein the at least one electrical contact element is designed as a material volume element.

2. The lighting module as claimed in claim 1, wherein the material volume element is essentially metallic.

3. The lighting module as claimed in claim 1, wherein the material volume element is coated.

4. The lighting module as claimed in claim 3, wherein the material volume element is tin-plated.

5. The lighting module as claimed in claim 1, wherein the material volume element is square.

6. The lighting module as claimed in claim 1, wherein the material volume element can be contacted at least at a front end.

7. The lighting module as claimed in claim 1, wherein the material volume element can be installed on the strip-shaped carrier with an assembly process.

8. The lighting module as claimed in claim 1, wherein the strip-shaped carrier is assembled into an assembled carrier and the assembled carrier is encapsulated in a material that is at least partially pellucid.

9. The lighting module as claimed in claim 8, wherein the assembled carrier is encapsulated in a silicone material.

10. The lighting module as claimed in claim 9, wherein the assembled carrier is inserted into an opaque silicone profile and is encapsulated in the opaque silicone profile by a pellucid encapsulating material made of silicone, wherein the at least one light source is arranged such that it can emit rays through the pellucid encapsulating material.

11. A lighting strip comprising: a plurality of contiguous lighting modules each lighting module comprising: a strip-shaped carrier, wherein at least one light source, and at least one electrical contact element that can be contacted at the edge are present on the strip-shaped carrier, wherein the at least one electrical contact element is designed as a material volume element; and wherein the lighting strip can be separated between two adjacent lighting modules.

12. A method for preparing a lighting strip comprising:
separating the lighting strip between at least two adjacent lighting modules, and removing material on at least one separation surface until at least one material volume element concerned is exposed in a manner allowing for contact, wherein the lighting strip comprises: a plurality of contiguous lighting modules each lighting,module comprising: a strip-shaped carrier, wherein at least one light source, and at least one electrical contact element that can be contacted at the edge are present on the strip-shaped carrier, wherein the at least one electrical contact element is designed as a material volume element and wherein the lighting strip can be separated between two adjacent lighting modules.

13. The method as claimed in claim 12, wherein the step relating to removal involves grinding, filing or abrading.

14. The lighting module as claimed in claim 1, wherein the at least one light source is a semiconductor lighting element.

15. The lighting module as claimed in claim 2, wherein the material volume element incorporates copper.

16. The lighting module as claimed in claim 5, wherein the material volume element is cuboid.

17. The lighting module as claimed in claim 1, wherein the at least one electrical contact element are installed on the carrier by an electrically conductive adhesive.

* * * * *